(12) United States Patent
Kwak et al.

(10) Patent No.: US 12,317,721 B2
(45) Date of Patent: May 27, 2025

(54) DISPLAY APPARATUS

(71) Applicant: Samsung Electronics Co., Ltd., Suwon-si (KR)

(72) Inventors: Seungyeon Kwak, Suwon-si (KR); Jiwhan Kim, Seoul (KR); Sunghun Lee, Hwaseong-si (KR); Deukseok Chung, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 348 days.

(21) Appl. No.: 17/502,349

(22) Filed: Oct. 15, 2021

(65) Prior Publication Data

US 2022/0037417 A1 Feb. 3, 2022

Related U.S. Application Data

(63) Continuation of application No. 16/044,578, filed on Jul. 25, 2018, now abandoned.

(30) Foreign Application Priority Data

Nov. 2, 2017 (KR) .......................... 10-2017-0145378

(51) Int. Cl.
*H10K 59/38* (2023.01)
*H10K 50/852* (2023.01)
(Continued)

(52) U.S. Cl.
CPC ........... *H10K 59/38* (2023.02); *H10K 50/856* (2023.02); *H10K 59/35* (2023.02); *H10K 50/852* (2023.02);
(Continued)

(58) Field of Classification Search
CPC .... H10K 59/38; H10K 59/1213; H10K 59/35; H10K 50/856; H10K 50/854;
(Continued)

(56) References Cited

U.S. PATENT DOCUMENTS

2002/0093284 A1* 7/2002 Adachi ................ H10K 50/868
313/506
2005/0116619 A1* 6/2005 Kuma .................. H10K 50/125
313/503
(Continued)

FOREIGN PATENT DOCUMENTS

JP 2002/268568 A 9/2002
KR 1020160070272 A 6/2016

OTHER PUBLICATIONS

KR Korean Office Action for Korean Patent Application No. 10-2017-0145378 dated Nov. 23, 2021.
(Continued)

*Primary Examiner* — Donald H B Braswell
*Assistant Examiner* — John Lin
(74) *Attorney, Agent, or Firm* — CANTOR COLBURN LLP (57) ABSTRACT

A display apparatus includes an organic light-emitting device (OLED) substrate, a color control layer; a first optical layer to which the generated light of the organic light-emitting substrate is incident and from which wavelength range light is provided to the color control layer; and a second optical layer to which the wavelength-converted light of the color control layer is incident and from which display light is provided for displaying an image The first optical layer partially transmits and partially reflects light of a first wavelength range, and reflects light of a second wavelength range and light of a third wavelength range each different from the first wavelength range. The second optical layer reflects light of the first wavelength range, and transmits each of light of the second wavelength range and light of the third wavelength range.

17 Claims, 5 Drawing Sheets

(51) Int. Cl.
*H10K 50/856* (2023.01)
*H10K 59/35* (2023.01)
*H10K 59/80* (2023.01)
*H10K 50/854* (2023.01)
*H10K 59/121* (2023.01)
*H10K 102/00* (2023.01)

(52) U.S. Cl.
CPC ....... *H10K 50/854* (2023.02); *H10K 59/1213* (2023.02); *H10K 2102/331* (2023.02)

(58) Field of Classification Search
CPC ........... H10K 50/852; H10K 2102/331; H10K 59/876; H10K 59/877; H10K 59/878
See application file for complete search history.

(56) References Cited

U.S. PATENT DOCUMENTS

| | | | | |
|---|---|---|---|---|
| 2007/0046180 | A1* | 3/2007 | Kao | H10K 59/876 313/504 |
| 2008/0204366 | A1* | 8/2008 | Kane | H05B 33/10 345/44 |
| 2012/0025244 | A1* | 2/2012 | Suh | H01L 33/38 257/98 |
| 2013/0021793 | A1* | 1/2013 | Zimmerman | F21K 9/62 362/231 |
| 2015/0308658 | A1* | 10/2015 | Shin | B32B 27/00 362/84 |
| 2015/0310826 | A1* | 10/2015 | Jo | G09G 3/3208 345/82 |
| 2016/0070137 | A1* | 3/2016 | You | G02F 1/133609 349/71 |
| 2016/0163768 | A1 | 6/2016 | Song et al. | |
| 2017/0343859 | A1* | 11/2017 | Chen | G02B 5/201 |

OTHER PUBLICATIONS

PTO-0892 Notices of References Cited and PTO-1449 Notices indicating references considered in parent U.S. Appl. No. 16/044,578 (6 pages, previously submitted with filing of the instant Application on Oct. 15, 2021 and resubmitted herewith).

* cited by examiner

DISPLAY APPARATUS

CROSS-REFERENCE TO RELATED APPLICATION

This application a continuation application of U.S. application Ser. No. 16/044,578 filed Jul. 25, 2018, which claims priority to Korean Patent Application No. 10-2017-0145378, filed on Nov. 2, 2017, and all the benefits accruing therefrom under 35 U.S.C. § 119, the disclosure of which is incorporated herein in its entirety by reference.

BACKGROUND

1. Field

The present disclosure relates to display apparatuses.

2. Description of the Related Art

Quantum dots are nanometer-sized semiconductor crystals, and an energy bandgap of a quantum dot may be adjusted according to the size and shape of the quantum dot. When a semiconductor material is reduced to a size of nanometers like the quantum dot, unique optical characteristics may be generated due to a quantum mechanics phenomenon. In particular, quantum dots having high light-emitting efficiency in the visible light region and a narrow full width at half maximum ("FWHM") are being researched as a next generation display material.

Research on the application of quantum dots to displays has been performed largely in two directions. One is a photoluminescence ("PL") method of exciting quantum dots by using an external light source to radiate light, and the other is an electroluminescence ("EL") method of exciting quantum dots by using electricity to radiate light.

Hybrid technologies of applying quantum-dot materials to organic light-emitting device ("OLED") type displays have drawn attention. OLEDs do not use liquid crystal unlike liquid crystal displays ("LCDs") and have superior efficiency compared to the LCDs, and are advantageous in the implementation of flexible display devices.

SUMMARY

Provided are display apparatuses having excellent performance.

Provided are display apparatuses having high light utilization efficiency and superior color characteristics.

Provided are display apparatuses which may improve a form factor such as flexibility thereof and may be usefully applied to various fields.

Provided are display apparatuses having an organic light-emitting device ("OLED") light source and a plurality of quantum-dot color conversion elements.

Additional features will be set forth in part in the description which follows and, in part, will be apparent from the description, or may be learned by practice of the presented embodiments.

According to an embodiment, a display apparatus includes an organic light-emitting device ("OLED") substrate which generates a light; a color control layer which wavelength-converts light incident thereto; a first optical layer to which the generated light of the organic light-emitting device substrate is incident and from which wavelength range light is provided to the color control layer; and a second optical layer to which the wavelength-converted light of the color control layer is incident and from which display light is provided for displaying an image. The first optical layer partially transmits and partially reflects light of a first wavelength range, and reflects light of a second wavelength range and light of a third wavelength range each different from the first wavelength range, and the second optical layer reflects light of the first wavelength range, and transmits each of light of the second wavelength range and light of the third wavelength range.

The OLED substrate may generate a blue light, and the color control layer may include a red pixel area including a first quantum dot which converts the blue light incident thereto to red color light, a green pixel area including a second quantum dot which converts the blue light incident thereto to green color light, and a blue pixel area which transmits the blue light incident thereto.

The color control layer may include a red pixel area, a green pixel area, and a blue pixel area, the first optical layer may be provided facing each of the red pixel area, the green pixel area and the blue pixel area, and the second optical layer may face the red pixel area and the green pixel area, except the blue pixel area.

The light of the first wavelength range may have a central wavelength of about 420 nanometers (nm) to about 480 nm, the light of the second wavelength range may have a central wavelength of about 500 nm to about 550 nm, and the light of the third wavelength range may have a central wavelength of about 600 nm to about 650 nm.

The first optical layer may include a first dichroic filter which partially transmits and partially reflects a blue light and reflects a green light and a red light, and the second optical layer may include a second dichroic filter which reflects the blue light and transmits the green light and the red light.

The first optical layer may have a reflectance of about 30% to about 70% with respect to the light of the first wavelength range.

The first optical layer may have a transmittance of about 30% to about 70% with respect to the light of the first wavelength range.

The first optical layer may have characteristics of a short pass dichroic filter that transmits light of a wavelength range shorter than the second optical layer, and the second optical layer may have characteristics of a long pass dichroic filter that transmits light of a wavelength range longer than the first optical layer.

At least one of the first optical layer and the second optical layer may include a first material layer having a first refractive index and a second material layer having a second refractive index which is alternately and repeatedly stacked with the first material layer, the first material layer may include any one of magnesium fluoride, thorium fluoride, silicon dioxide, aluminum oxide, sodium aluminum fluoride, cryolite, and epoxy, and the second material layer may include any one of tantalum pentoxide, niobium pentoxide, zinc sulfide, zinc selenide, hafnium dioxide, zirconium dioxide, and titanium dioxide.

The OLED substrate may include a first electrode, a second electrode, and an organic emission layer between the first and second electrodes, the first electrode, the organic emission layer and the first optical layer may be provided in order, and the first electrode, the first optical layer and the organic emission layer between the first electrode and the first optical layer may form a resonance cavity structure at which the generated light resonates between the first electrode and the first optical layer to be perpendicularly provided toward the color control layer.

The second optical layer may have an anti-glare processed emitting surface through which the display light is provided from the second optical layer.

The organic light-emitting device substrate may include a plurality of pixel areas at which the light is generated, and the display apparatus may further include a thin film transistor layer with which the pixel areas of the organic light-emitting device substrate are controlled to generate the light, the thin film transistor layer disposed between the organic light-emitting device substrate and the color control layer.

According to another embodiment, a display apparatus includes an organic light-emitting device ("OLED") substrate including a first electrode, a second electrode, and an organic emission layer between the first and second electrodes; a color control layer which wavelength-converts light incident thereto; a first optical layer to which the generated light of the organic light-emitting device is incident and from which wavelength range light is provided to the color control layer; and a second optical layer to which the wavelength-converted light of the color control layer is incident and from which display light is provided for displaying an image, the second optical layer having transmission characteristics different from the first optical layer and reflection characteristics different from the first optical layer. The first electrode, the organic emission layer and the first optical layer are disposed in order to form a resonance cavity structure at which the generated light resonates between the first electrode and the first optical layer to be perpendicularly provided toward the color control layer.

The first optical layer may partially transmit and partially reflect light of a first wavelength range and reflect light of a second wavelength range and light of a third wavelength range, and the second optical layer may reflect light of the first wavelength range and transmit light of the second wavelength range and light of the third wavelength range.

The first optical layer may partially transmit and partially reflect light of a first wavelength range, and may have a reflectance of about 30% to about 70% with respect to the light of the first wavelength range.

The first optical layer may have characteristics of a short pass dichroic filter which transmits light of a wavelength range shorter than the second optical layer, and the second optical layer may have characteristics of a long pass dichroic filter which transmits light of a wavelength range longer than the first optical layer.

The OLED substrate may generate a blue light, and the color control layer may include a red pixel area including a first quantum dot which converts the blue light incident thereto to red color light, a green pixel area including a second quantum dot which converts the blue light incident thereto to green color light, and a blue pixel area which transmits the blue light incident thereto.

The OLED substrate may be a bottom-surface emission type device.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Various exemplary embodiments will now be described more fully with reference to the accompanying drawings in which exemplary embodiments are shown.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. "At least one" is not to be construed as limiting "a" or "an." "Or" means "and/or." As used herein the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to a display apparatus according to embodiments, examples of which are illustrated in the accompanying drawings. In the drawings, the width and thicknesses of layers and regions are exaggerated for clarity of the specification and for convenience of explanation. Like reference numerals refer to like elements throughout.

Figure 1:
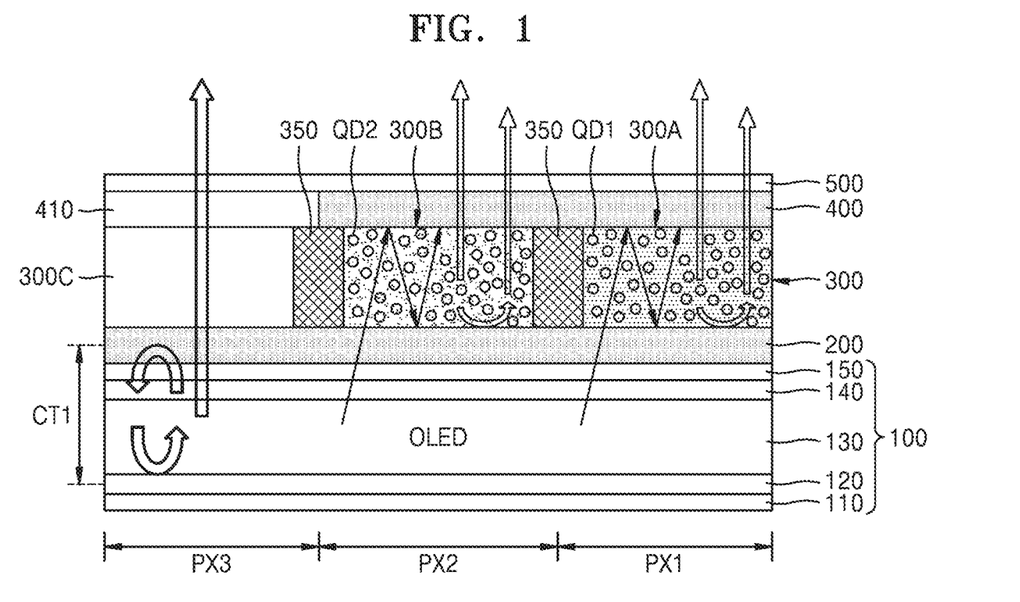
FIG. 1 is a cross-sectional view of a display apparatus according to an embodiment.

FIG. 1 is a cross-sectional view of a display apparatus according to an embodiment.

Referring to FIG. 1, within the display apparatus, a display substrate such as an organic light-emitting device ("OLED") substrate 100 may be provided to generate light used in displaying an image, and a color control layer 300 may be provided to adjust the color of light incident thereto which is generated and provided from the OLED substrate 100. A first optical layer 200 may be provided between the OLED substrate 100 and the color control layer 300, and a second optical layer 400 may be provided on the color control layer 300 such as at a light emitting side thereof. The color control layer 300 may be arranged between the first optical layer 200 and the second optical layer 400, such as in a direction in which light is emitted from the display apparatus. An interface may be formed between respective adjacent elements among the color control layer 300, the first optical layer 200 and the second optical layer 400.

The OLED substrate 100 may be a light source of the display apparatus, and may include a first electrode 120, a second electrode 140, and an OLED layer 130 provided therebetween. The first electrode 120 may be a cathode and the second electrode 140 may be an anode, or vice versa. The OLED layer 130 may include at least one organic emission layer. Furthermore, the OLED layer 130 may further include an electron transport layer and a hole transport layer, and additionally, a hole injection layer and an electron injection layer.

Along a thickness direction of the display apparatus, within the OLED substrate 100, a first transparent substrate 110 may be further provided under the first electrode 120, and a second transparent substrate 150 may be further provided above the second electrode 140. Accordingly, the first electrode 120, the OLED layer 130, and the second electrode 140 may each be provided between the first transparent substrate 110 and the second transparent substrate 150. The first transparent substrate 110 may define an outer surface of the overall display apparatus, without being limited thereto. The second transparent substrate 150 may define an outer surface of the overall OLED substrate 100, such as a light exit surface of the OLED substrate 100, without being limited thereto.

The first and second transparent substrates 110 and 150 may include, for example, glass or other transparent film. The first and second transparent substrates 110 and 150 may be flexible. In some cases, the first transparent substrate 110 may be replaced by an opaque substrate.

The OLED substrate 100 as a light source of the display apparatus may be, for example, a blue OLED substrate that generates a blue light. In this case, the OLED substrate 100 may be configured to generate and/or emit a blue light having a peak wavelength range of about 420 nanometers (nm) to about 500 nm or about 450 nm to about 480 nm. The organic emission layer of the OLED substrate 100 may include a blue fluorescent material and/or a blue phosphor material. However, the OLED substrate 100 is not limited to the blue OLED substrate, and a configuration thereof may be changed in various ways.

The color control layer 300 may include quantum dots to convert the color of light generated from the OLED substrate 100 into another color different from the generated color. In this point, the color control layer 300 may be referred to as a quantum-dot color converter or a quantum-dot color filter. The color control layer 300 may include a first color control element 300A having a first quantum dot QD1 provided in plurality for red conversion and a second color control element 300B having a second quantum dot QD2 provided in plurality for green conversion. Furthermore, the color control layer 300 may further include a light-transmitting element 300C that does not include quantum dots. The light-transmitting element 300C may be a light scattering element including a light scattering agent therein to scatter light incident thereto which is provided from the OLED substrate. The light-transmitting element 300C may not convert a color of the light provided from the OLED substrate 100 and may maintain the color to be emitted from the color conversion layer 300 at the light-transmitting element 300C.

The first color control element 300A may be a red-QD containing layer, and may convert the light generated from the OLED substrate 100 to red (R) light. The second color control element 300B may be a green-QD containing layer, and may convert the light generated from the OLED substrate 100 to green (G) light. Accordingly, the first color control element 300A may be referred to as a first color converter or a first color conversion element, and the second color control element 300B may be referred to as a second color conversion element or a second color converter. Where blue (B) light is provided from the OLED substrate 100, the light-transmitting element 300C may transmit blue (B) light.

In an exemplary embodiment, the first and second color conversion elements may be include a combination of a resin material, certain quantum dots and a light scattering agent. The light-transmitting element 300C may include a resin material and a light scattering agent, and exclude quantum dots. The resin material may include, for example, a photoresist ("PR") material. The light scattering agent may include, for example, titanium oxide ($TiO_2$), etc., but the present disclosure is not limited thereto.

The display apparatus may include a pixel provided in plurality at which light is generated or transmitted. The pixels may provide the light within the display apparatus for displaying an image. The first color control element 300A may correspond to a red (R) pixel area (or sub-pixel area) PX1. The second color control element 300B may correspond to a green (G) pixel area (sub-pixel area) PX2. The light-transmitting element 300C may correspond to a blue (B) pixel area (sub-pixel area) PX3. One or more of these pixel areas may be provided in plurality along the light-emitting surface of the OLED substrate 100.

An RGB full color of the display apparatus may be implemented by the color control layer 300 including the various color pixel areas described above. The arrangement sequence or arrangement method of RGB sub-pixels PX1, PX2 and PX3 are exemplary and may be changed in various ways. In an exemplary embodiment, the display apparatus and layers thereof may be disposed along a plane defined by first and second directions which cross each other. In FIG. 1, for example, the horizontal direction may represent the first direction and/or the second direction. A thickness of the display apparatus and layers thereof may be taken along a third direction which crosses each of the first and second directions. In FIG. 1, for example, the vertical direction may represent the thickness direction. A light emission direction may be defined in an upward direction along the thickness of the display apparatus in FIG. 1, without being limited thereto.

The first quantum dots QD1 that may be included in the first color control element 300A may be red-QDs, and the second quantum dots QD2 that may be included in the second color control element 300B may be green-QDs. A quantum dot means a semiconductor particle having a spherical shape of a nanometer (nm) size or a similar shape thereof, and may have a size (diameter) of about several nanometers to about several tens of nanometers. The quantum dot may have a singleton structure or a core-shell structure, and for a core-shell structure, the quantum dot may have a single-shell or multi-shell structure. In an instance, a quantum dot may be configured with a core portion (central body) including or formed of a first semiconductor, and a skin portion (shell body) including or formed of a second semiconductor.

In exemplary embodiments, the core portion (central body) material may include cadmium selenide (CdSe), cadmium telluride (CdTe), cadmium sulfide (CdS), etc., and the skin portion (shell body) material may include zinc sulfide (ZnS), etc. Furthermore, a non-cadmium series quantum dot ("QD") may be used. In other words, a variety of materials that does not include cadmium (Cd) may be applied to the quantum dot. However, the above-described materials are exemplary, and various other materials may be applied to the quantum dot. In an exemplary embodiment, for example, the quantum dot may include at least one material of II-VI group semiconductor, III-V group semiconductor, IV-VI group semiconductor and IV group semiconductor material.

Since the quantum dot has a relatively very small size, a quantum confinement effect may be obtained. When particles are very small, electrons in the particle have a discontinuous energy state by an outer wall of a particle. In this case, as the size of a space in the particle decreases, the energy state of the electrons relatively increases and an energy band gap increases, which is referred to as the quantum confinement effect. According to the quantum confinement effect, when light such as an infrared ray or a visible ray is incident on quantum dots, light having a wavelength of various ranges different from those of the incident light may be generated.

The wavelength of light generated from a quantum dot may be determined based on the size, material, or structure of a particle (quantum dot). In detail, when light of a wavelength having energy greater than the energy band gap is incident on a quantum dot, the quantum dot may absorb energy of the light to be excited, and may return to the ground state by emitting light of a specific wavelength different from that of the incident light. In this case, as the size of a quantum dot (or the core portion of the quantum dot) decreases, light of a relatively short wavelength, for example, a blue-based light or a green-based light may be generated. As the size of a quantum dot (or the core portion of the quantum dot) increases, light of a relatively long wavelength, for example, a red-based light may be generated. Accordingly, light of various colors may be implemented depending on the size of a quantum dot (or the core portion of the quantum dot) disposed within a color control element.

A quantum dot particle capable of emitting a green-based light may be referred to as a green light quantum dot particle (or green quantum dot particle), and a quantum dot particle capable of emitting a red-based light may be referred to as a red light quantum dot particle (or red quantum dot particle). In an exemplary embodiment, for example, a green light quantum dot particle (or the core part) may be a particle having a width (diameter) of about 2 nm to about 3 nm, and a red light quantum dot particle (or the core part) may be a particle having a width (diameter) of about 5 nm to about 6 nm. The emission wavelength of light emitted from a color control element including a quantum dot may be adjusted not only by the size (diameter) of a quantum dot, but also by the constituent material and/or structure thereof.

In the color control layer 300, a partition wall 350 provided in plurality may be provided respectively between the first color control element 300A, the second color control element 300B, and the light-transmitting element 300C. The partition walls 350 may be a light-blocking element, such as a black matrix. The partition walls 350 may define a light-emitting region and/or a pixel area of the display apparatus, without being limited thereto. In an exemplary embodiment of manufacturing a display apparatus, after the partition walls 350 are formed, the first color control element 300A, the second color control element 300B, and the light-transmitting element 300C may be respectively formed in areas defined by the partition walls 350.

The first optical layer 200 may be provided between the OLED substrate 100 and the color control layer 300, and the second optical layer 400 may be provided on the color control layer 300 such as at a light-emitting side of the overall display apparatus. The first optical layer 200 may be provided under the color control layer 300 along a thickness of the display apparatus, to commonly cover all of a red pixel area PX1, a green pixel area PX2 and a blue pixel area PX3 in a top plan view of the display apparatus (e.g., viewing the display apparatus from the light-emitting side thereof, such; as in a direction from the second optical layer 400 to the first optical layer 200). The second optical layer 400 may be provided on the color control layer 300, to commonly cover the red pixel area PX1 and the green pixel area PX2, except the blue pixel area PX3 in the top plan view.

The first optical layer 200 may selectively transmit light, so as to partially transmit and partially reflect light of a first wavelength range, and may reflect (e.g., totally reflect or substantially totally reflect) light of both a second wavelength range and light of a third wavelength range. The first optical layer 200 has semi-transmissive and semi-reflective characteristics with respect to the light of the first wavelength range.

The second optical layer 400 may have different transmission and reflection characteristics from the first optical layer 200. The second optical layer 400 may reflect (e.g., totally reflect or substantially totally reflect) the light of the first wavelength range, and may transmit both the light of the second wavelength range and the light of the third wavelength range.

The first optical layer 200 may have a reflectance of about 30% to about 70% or about 35% to about 65% with respect to the light of the first wavelength range. Furthermore, the first optical layer 200 may have a transmittance of about 30% to about 70% or about 35% to about 65% with respect to the light of the first wavelength range. The first optical layer 200 may have a reflectance of about 80% or more or about 90% or more with respect to both the light of the second wavelength range and the light of the third wavelength range. The second optical layer 400 may have a reflectance of about 80% or more or about 90% or more with respect to the light of the first wavelength range, and a transmittance of about 80% or more or about 90% or more with respect to both the light of the second wavelength range and the light of the third wavelength range.

In exemplary embodiments, the light of the first wavelength range may corresponding to a wavelength range of blue light, the light of the second wavelength range may correspond to a wavelength range of green light, and the light of the third wavelength range may correspond to a wavelength range of red light. In an exemplary embodiment, for example, the first wavelength range or a central wavelength thereof may be about 420 nm to about 500 nm or about 420 nm to about 480 nm, the second wavelength range or a central wavelength thereof may be about 500 nm to about 550 nm or about 510 nm to about 540 nm, and the third wavelength range or a central wavelength thereof may be about 610 nm to about 760 nm or about 600 nm to about 650 nm.

In a detailed example, the first optical layer 200 may be a first dichroic filter that partially transmits and partially reflects a blue light, and reflects both a green light and a red light. The second optical layer 400 may be a second dichroic filter that reflects the blue light and transmits both the green light and the red light. In this state, the first optical layer 200 may have characteristics of a relatively short pass dichroic filter that transmits light of a wavelength range shorter than that of the second optical layer 400. The second optical layer 400 may have characteristics of a relatively long pass dichroic filter that transmits light of a wavelength range longer than that of the first optical layer 200.

The operations of the first optical layer 200 and the second optical layer 400 are described below in detail. The first optical layer 200 may partially transmit and partially reflect light, for example, a blue light, generated from the OLED substrate 100 and incident to the first optical layer 200. In this regard, the first optical layer 200 and the first electrode 120 of the OLED substrate 100 may form a resonance cavity structure CT1 with the organic emission layer at the OLED layer 130 interposed therebetween. Accordingly, the light generated from the organic emission layer may be reinforced within the OLED substrate 100 by resonating between the first optical layer 200 and the first electrode 120 (represented by the upward and downward curved arrows in FIG. 1) and may be finally radiated upward (represented by the upward vertical arrow in FIG. 1) to be transmitted above the first optical layer 200 such as at a respective color control element among 300A, 300B and 300C. The upward-radiated light may exit from the first optical layer 200 via an outer emitting surface thereof facing the color control layer 300. Accordingly, due to the resonance cavity structure CT1, out-coupling characteristics and straightness (e.g., in a direction substantially perpendicular to the color control layer 300) of the light generated within and emitted from the OLED substrate 100 toward the color control layer 300 may be much improved. The reinforced excited light may be incident not only at the light-transmitting element 300C represented by the curved upward and downward curved arrows in FIG. 1, but similarly on the quantum dots QD1 and QD2 of the color control layer 300 at a respective color control element thereof, and thus color conversion efficiency may be improved.

Furthermore, at the outer emitting surface of the first optical layer 200, the first optical layer 200 may reflect light (red light and green light) emitted downward from the quantum dots QD1 and QD2 to be directed upward towards the second optical layer 400 (represented by the upward curved arrow within 300A and 300B in FIG. 1). Since the lights emitted from the quantum dots QD1 and QD2 have isotropy to a degree, the red light and the green light generated by the quantum dots QD1 and QD2 may partially travel not only in an upward direction from the color control layer 300 toward the second optical layer 400, but also in a downward direction from the color control layer 300 toward the first optical layer 200. In other words, a portion of each of the red light and the green light generated by the quantum dots QD1 and QD2 may travel downward toward the first optical layer 200. At the outer emitting surface of the first optical layer 200, the first optical layer 200 may reflect the red light and the green light to be radiated upward and emitted from the first optical layer 200 toward the second optical layer 400. Accordingly, extraction efficiency of the red light and the green light may be improved by the first optical layer 200.

At the outer emitting surface of the second optical layer 400, the second optical layer 400 which is commonly disposed at light emitting surfaces of the first and second color control elements 300A and 300B may reflect the blue light of the OLED substrate 100 that is not primarily absorbed by the quantum dots QD1 and QD2 of the first color control element 300A and the second color control element 300B to return the blue light to the quantum dots QD1 and QD2 (represented by the solid line arrows in FIG. 1). Since the blue light (excited light) is recycled by being reflected between the second optical layer 400 and the first optical layer 200, an optical path of the blue light increases so that the light emission efficiency of the quantum dots QD1 and QD2 may be improved.

Furthermore, since the light emission efficiency of the quantum dots QD1 and QD2 may be improved by the recycling of the light between the first and second optical layers 200 and 400, an amount of the light scattering agent within the color control layer 300 (e.g., the content of the light scattering agent in 300A and 300B) such as $TiO_2$ used to increase the optical path may be reduced. When the content of the light scattering agent in the first and second color control elements 300A and 300B decreases, a content and/or density of the quantum dots QD1 and QD2 relatively increases, and thus the efficiency of light used to display an image may be further improved and while restricting reflection of external light incident from outside the display apparatus by the light scattering agent. Moreover, the second optical layer 400 may improve color purity of the color light emitted from the display apparatus to display an image, by reducing or effectively preventing escape of the blue light of the OLED substrate 100 to outside the display apparatus from light-emitting areas respectively disposed at the first and second color control elements 300A and 300B.

At least one of the first optical layer 200 and the second optical layer 400 may have a structure in which, for example, a first material layer having a first refractive index and a second material layer having a second refractive index are alternately and repeatedly stacked within the respective layer. The first refractive index may be a relatively low refractive index or lower than the second refractive index, and the second refractive index may be a relatively high refractive index or higher than the first refractive index. In exemplary embodiments, the first material layer described above may include, for example, any one of magnesium fluoride, thorium fluoride, silicon dioxide, aluminum oxide, sodium aluminum fluoride, cryolite, and epoxy. The second material layer described above may include, for example, any one of tantalum pentoxide, niobium pentoxide, zinc sulfide, zinc selenide, hafnium dioxide, zirconium dioxide, and titanium dioxide.

A dichroic filter having controlled transmission characteristics and reflection characteristics may be made by repeatedly stacking two material layers having different refractive indexes from each other and adjusting the thickness and the number of the layers. The dichroic filter structure may be applied to the first optical layer 200 and/or the second optical layer 400. At least one of the first optical layer 200 and the second optical layer 400 may have a distributed Bragg reflector ("DBR") structure. Two dielectric layers having different refractive indexes from each other may be repeatedly stacked within an overall filter layer structure under the condition of a thickness of $\lambda/4$, where $\lambda$ is the wavelength of light, reflectance or transmittance of a desired wavelength band may be increased. The thickness of $\lambda/4$ may be a total thickness of the overall stack of dielectric layers, without being limited thereto. However, the detailed structures and materials of the first and second optical layers 200 and 400 are exemplary and may be changed in various ways.

In addition, a transparent cover layer 500 may be further provided on the second optical layer 400. The transparent cover layer 500 may form an outer surface of the overall display apparatus, such as forming the light-emitting surface of the overall display apparatus. The transparent cover layer 500 may include or be formed of glass or various other transparent materials. As necessary, the transparent cover layer 500 may be flexible.

Furthermore, a transparent layer 410 may be further provided on the color control layer 300 to be disposed adjacent to an end of the second optical layer 400. The transparent layer 410 and the second optical layer 400 may be in a same single layer of the display apparatus. Where the second optical layer 400 is provided in plurality commonly corresponding to the first and second color control elements 300A and 300B, and the elements 300A, 300B and 300C are repeated within the display apparatus, the transparent layer 410 may be disposed around the second optical layer 400 at opposing edges thereof. The transparent layer 410 may be provided on the light-transmitting element 300C, and may be excluded from the first and second color control elements 300A and 300B, without being limited thereto. The transparent cover layer 500 may be commonly provided on the transparent layer 410 and the second optical layer 400. The transparent cover layer 500 may be commonly disposed with respect to each of the pixel areas of the display apparatus, without being limited thereto.

Figure 2:
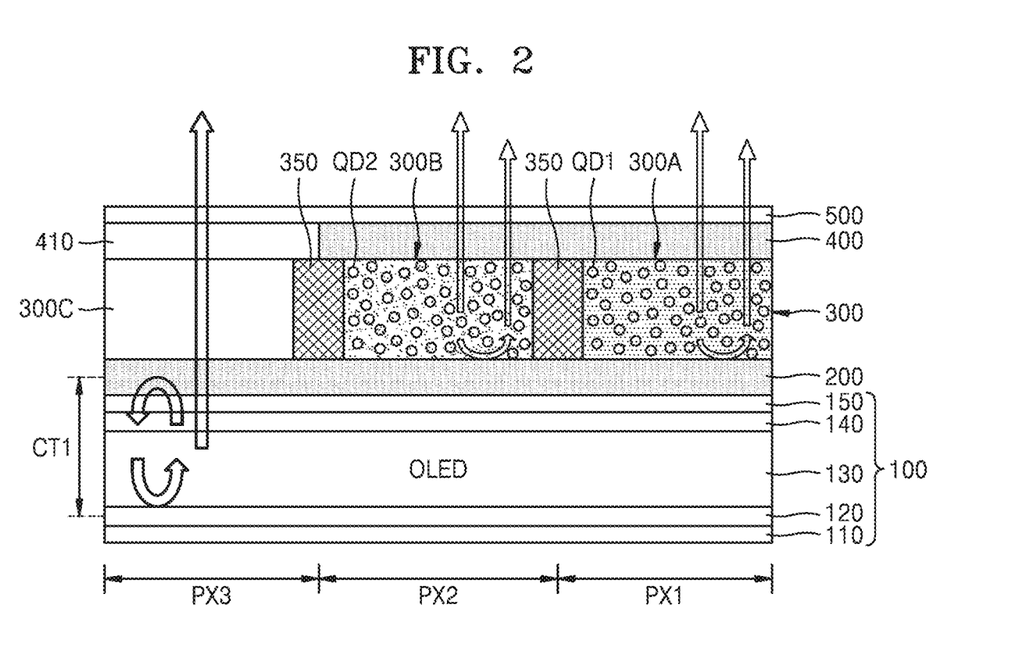
FIG. 2 is a cross-sectional view showing an embodiment of the characteristics and role of a first optical layer of FIG. 1 by emphasizing the same.

FIG. 2 is a cross-sectional view showing the characteristics and role of the first optical layer 200 of FIG. 1 by emphasizing the same. More particularly, FIG. 2 focuses on the recycling of light at the resonance cavity structure CT1 formed with the first optical layer 200, and the reflection of downward wavelength-converted light at the emitting surface of the first optical layer 200.

Referring to FIG. 2, the first optical layer 200 may partially transmit and partially reflect the light generated from the OLED substrate 100, for example, the blue light. The first optical layer 200 and the first electrode 120 may form the resonance cavity structure CT1. Accordingly, due to the resonance cavity structure CT1, the out-coupling characteristics and straightness of the light generated from the OLED substrate 100 and transmitted through the first optical layer 200 to be emitted therefrom may be much improved (represented by the upward and downward curved arrows and vertical arrow at light-transmitting element 300C in FIG. 2. Reinforced excited light may be radiated to the quantum dots QD1 and QD2, and thus color conversion efficiency may be improved. Furthermore, since the first optical layer 200 reflects the converted light (e.g., red light and green light at the first and second color conversion elements 300A and 300B) radiated downward from the quantum dots QD1 and QD2 back upward toward the second optical layer 400 (represented by the upward curved and vertical arrows within 300A and 300B in FIG. 2), the extraction efficiency of the red light and the green light may be improved.

Figure 3:
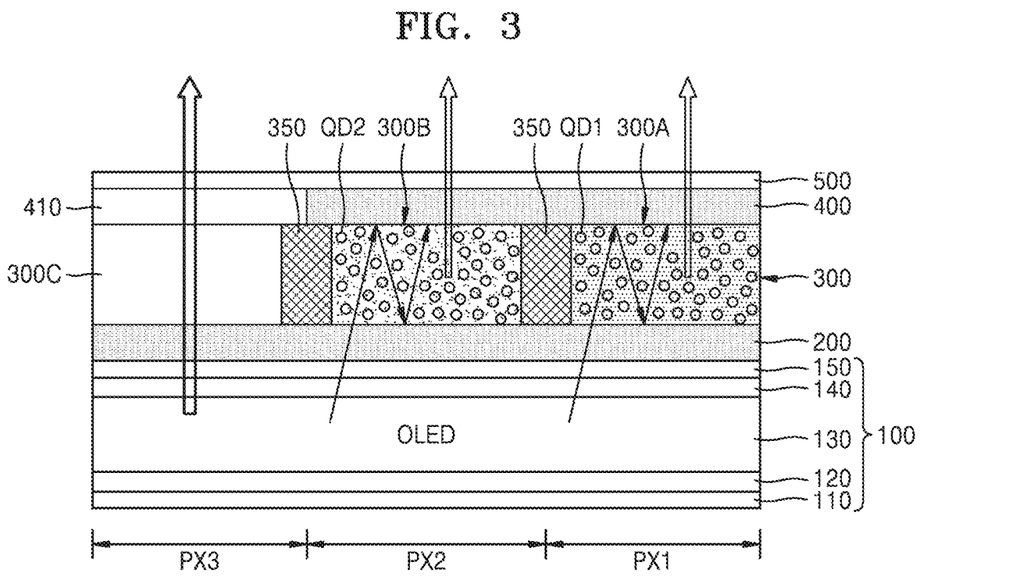
FIG. 3 is a cross-sectional view showing the characteristics and role of a second optical layer of FIG. 1 by emphasizing the same.

FIG. 3 is a cross-sectional view showing the characteristics and role of the second optical layer 400 of FIG. 1 by emphasizing the same. More particularly, FIG. 3 focuses on the reflection of light not primarily absorbed by the quantum dots QD1 and QD2 of the first color control element 300A and the second color control element 300B, at a light incident surface of the second optical layer 400.

Referring to FIG. 3, the second optical layer 400 may reflect the blue light that has not been primarily absorbed by the quantum dots QD1 and QD2 to return the blue light to the quantum dots QD1 and QD2. Since the blue light (excited light) is recycled by being reflected between the light incident surface of the second optical layer 400 and the light emitting surface of the first optical layer 200 (represented by the solid line arrows in FIG. 3), the optical path of the blue light may increase, and thus the light emission efficiency of the quantum dots QD1 and QD2 may be improved. Furthermore, since the light emission efficiency of the quantum dots QD1 and QD2 may be improved by the recycling of the light between the first and second optical layers 200 and 400, an amount or content of the light scattering agent may be reduced in the first and second color control elements 300A and 300B, the content and/or density of the quantum dots QD1 and QD2 is relatively increased, and thus the efficiency of light used to display an image may be further improved. Also, the external light reflection problem due to the light scattering agent may be prevented. Since the second optical layer 400 reduces or effectively prevents escape of the blue light from to outside the display apparatus from the light-emitting areas respectively disposed at the first and second color control elements 300A and 300B, color purity of the color light emitted from the display apparatus to display an image may be improved.

Figure 4:
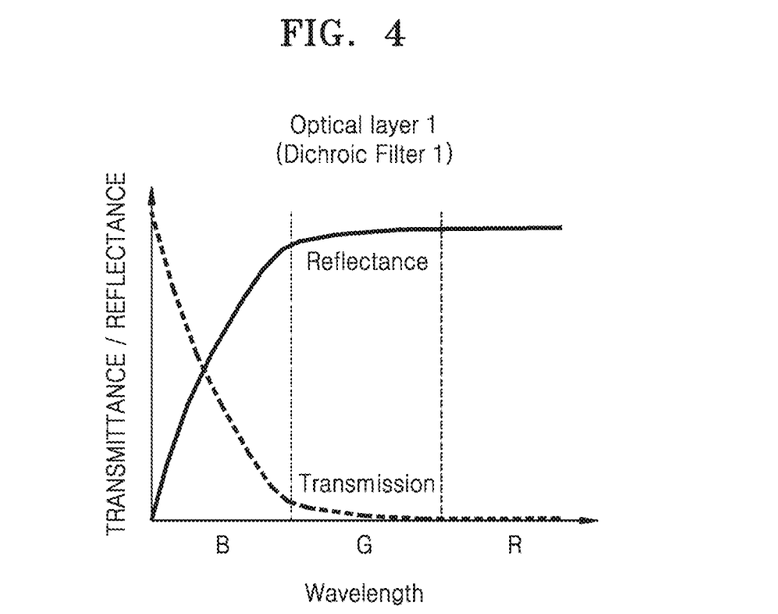
FIG. 4 is a graph showing an example of relative transmission and reflection characteristics of the first optical layer that is usable in a display apparatus according to an embodiment.

FIG. 4 is a graph showing an example of relative transmission and reflection characteristics of the first optical layer 200 that is usable in a display apparatus according to an embodiment.

Referring to FIG. 4, the first optical layer 200 may partially transmit and partially reflect the blue (B) light, and may reflect the green (G) light and the red (R) light. The first optical layer 200 may have the characteristics of a short pass dichroic filter that transmits light of a relatively shorter wavelength range than that of the second optical layer 400. In an exemplary embodiment, for example, the first optical layer 200 may have the characteristics of a cut-off dichroic filter having a cut-off wavelength (e.g., the wavelength at which the transmission decreases to 50% throughput in a short-pass filter) of about 450 nm. The cut-off wavelength may be, for example, about 430 nm to about 470 nm.

Figure 5:
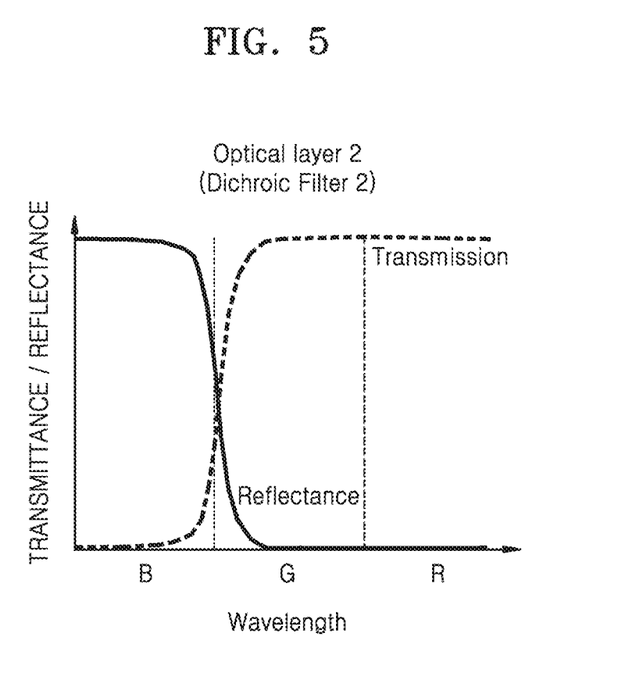
FIG. 5 is a graph showing an example of relative transmission and reflection characteristics of the second optical layer that is usable in a display apparatus according to an embodiment.

FIG. 5 is a graph showing an example of relative transmission and reflection characteristics of the second optical layer 400 that is usable in a display apparatus according to an embodiment.

Referring to FIG. 5, the second optical layer 400 may reflect the blue (B) light and transmit the green (G) light and the red (R) light. The second optical layer 400 may have the characteristics of a long pass dichroic filter that transmits light of a relatively longer wavelength range than that of the first optical layer 200. In an exemplary embodiment, for example, the second optical layer 400 may have the characteristics of a cut-on dichroic filter having a cut-on wavelength of about 500 nm (e.g., the wavelength at which the transmission increases to 50% throughput in a long-pass filter). The cut-on wavelength may be, for example, about 480 nm to about 520 nm.

According to one or more embodiment of the invention, by providing two optical layers 200 and 400 having different transmission characteristics and reflection characteristics respectively under and above the color control layer 300 adopting quantum dots, a display apparatus having relative high light efficiency and superior color characteristics may be manufactured. As compared to an existing liquid crystal display ("LCD"), a display apparatus capable of improving a form thereof (e.g., to be deformable) and being usefully applied to various fields of application may be manufactured.

Since an LCD is operated in a method of discarding light in green/blue ranges of a white light provided by a backlight to represent a red color and discarding light in red/blue ranges to represent a green color in a color filter, efficiency loss is generated. Also, since providing a flexible display device using the LCD backlight method is difficult, there is a limitation in improving the form factor of a display device, and the LCD backlight may be difficult to be used in various devices. Accordingly, there is a demand for a backlight-color filter method capable of improving light efficiency and implementing a flexible display. According to one or more embodiment of the invention, a display apparatus satisfying these requirements may be implemented.

Furthermore, since an absorption rate of quantum dots is lower than that of an organic dye, in order to use the quantum dots as a color filter within a conventional display device, the optical path of the excited light is increased or a scattering agent such as $TiO_2$ is dispersed in the quantum dot color filter. However, the scattering agent such as $TiO_2$ may increase external light reflection. In one or more embodiment of the invention, since the light efficiency of the quantum dots QD1 and QD2 may be increased by using the two optical layers 200 and 400, use of the scattering agent may be reduced and the problems due to the scattering agent may be restricted or effectively prevented as compared to the conventional display device.

Figure 6:
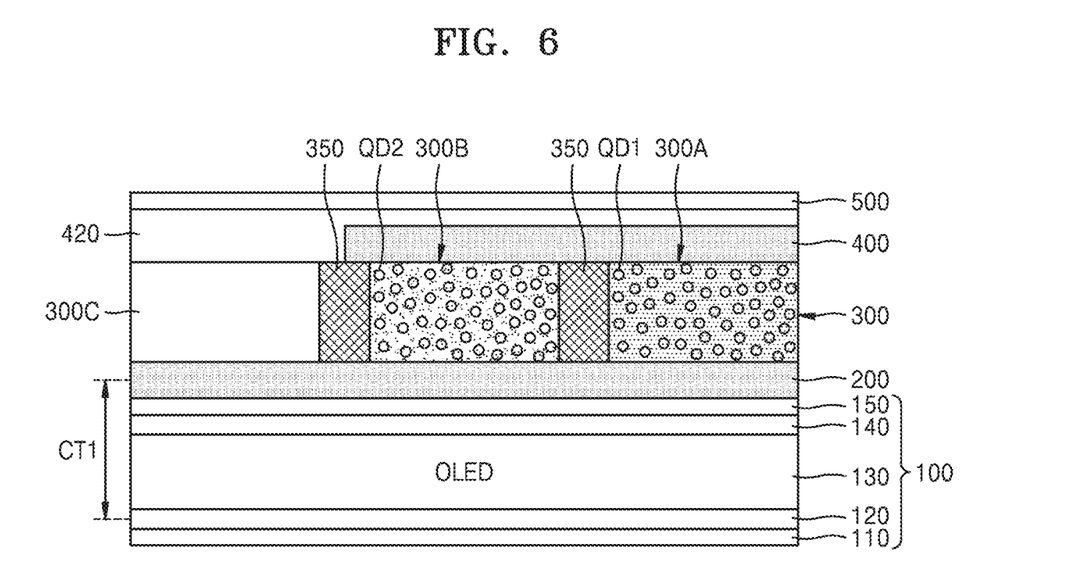
FIG. 6 is a cross-sectional view of a display apparatus according to another embodiment.

FIG. 6 is a cross-sectional view of a display apparatus according to another embodiment.

Referring to FIG. 6, a transparent layer 420 covering the second optical layer 400 may be provided on the color control layer 300. The transparent layer 420 disposed at a side surface of the second optical layer 420 extends to be disposed on a top surface of the second optical layer 420. The transparent cover layer 500 may be further provided on portions of the transparent layer 420 at the side surface and at the top surface of the second optical layer 420. In this case, the formation of the transparent cover layer 500 may be optional. In an exemplary embodiment, where the transparent cover layer 500 is omitted, an upper surface of the portions of the transparent layer 420 at the side surface and at the top surface of the second optical layer 420 may form a light-emitting surface of the overall display apparatus. The configuration of the display apparatus in FIG. 6 except the transparent layer 420 may be the same or similar to the configuration of FIG. 1.

Figure 7:
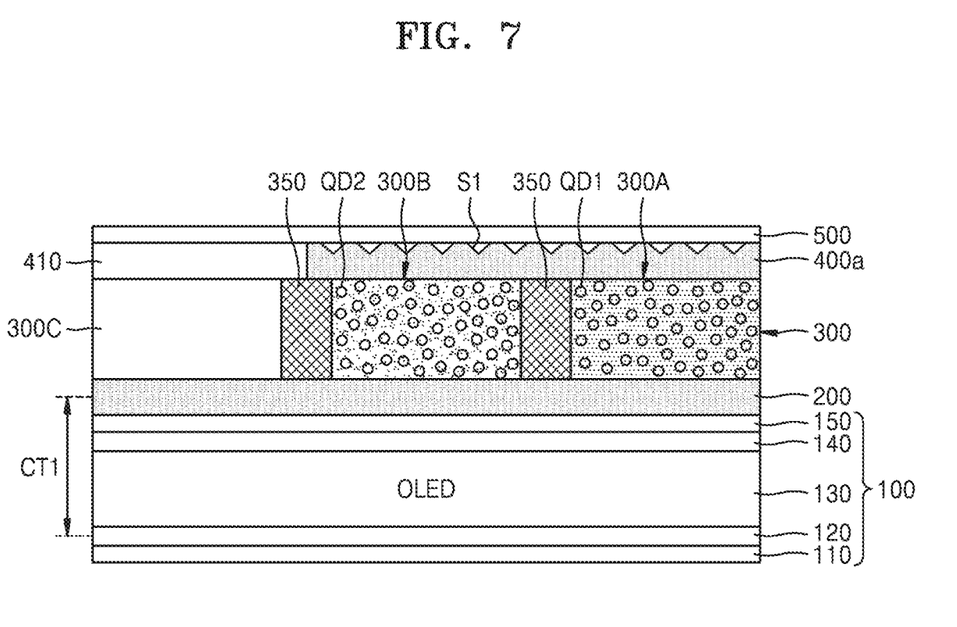
FIG. 7 is a cross-sectional view of a display apparatus according to still another embodiment.

FIG. 7 is a cross-sectional view of a display apparatus according to still another embodiment.

Referring to FIG. 7, a second optical layer 400a may have a surface S1 from which light is emitted from the second optical layer 400a, that is anti-glare processed. The anti-glare surface S1 may include, for example, an uneven structure. The uneven structure may include a plurality of ridges and valleys which define the surface S1 of the second optical layer 400a. As such, as the surface of the second optical layer 400a is anti-glare processed, reflection of external light from outside the display apparatus may be reduced or effectively prevented.

Although not illustrated, the surface of the transparent layer 410 may be anti-glare processed as described above for the second optical layer 400a. In the present embodiment, the configuration of the display apparatus in FIG. 7 except the surface of the second optical layer 400a may be the same or similar to the configuration of FIG. 1.

Figure 8:
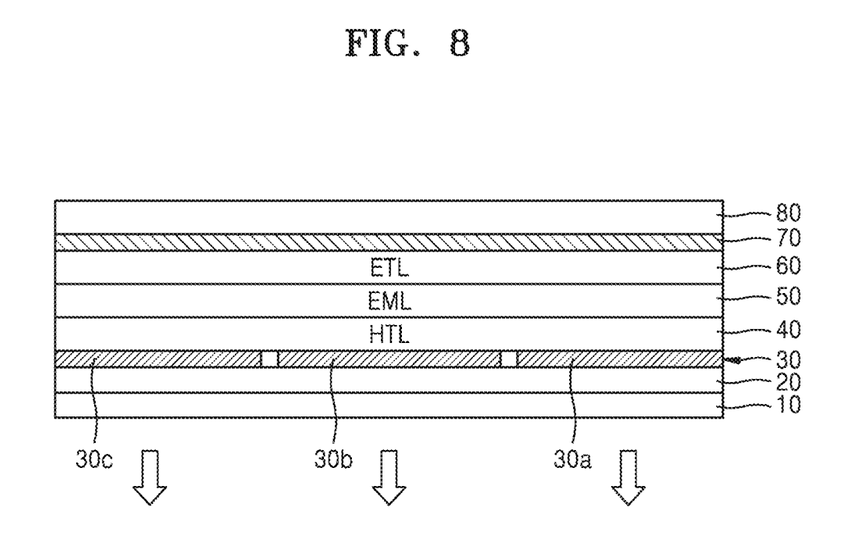
FIG. 8 is a cross-sectional view of a configuration of an organic light-emitting device ("OLED") element portion that is applicable to a display apparatus according to an embodiment.

FIG. 8 is a cross-sectional view of an OLED element portion that is applicable to a display apparatus according to an embodiment. The OLED element portion of FIG. 8 may represent a detailed structure of the OLED substrate 100 in the above-described embodiments, without being limited thereto.

Referring to FIG. 8, a thin film transistor ("TFT") array layer 20 including a plurality of thin film transistors TFTs (not shown) as switching devices may be provided on a transparent (base) substrate 10. Respective pixel areas of the display apparatus may be driven to display an image using layers and devices within the TFT array layer 20. The transparent substrate 10 and the TFT array layer 20 together may be referred to as one TFT array substrate. Alternatively, the TFT array layer 20 alone may be referred to as a TFT array substrate.

An anode electrode layer 30 including a plurality of anodes 30a, 30b and 30c may be provided on the TFT array layer 20. The anodes 30a, 30b and 30c may be elements patterned to correspond to the respective pixel (or sub-pixel) areas of a display apparatus. Each of the anodes 30a, 30b and 30c may be electrically connected to respective TFTs of the TFT array layer 20. The anodes 30a, 30b, and 30c may include or be formed of a transparent electrode material such as indium tin oxide ("ITO").

An emission layer ("EML") 50 including an organic material-based emission material may be provided on the anode electrode layer 30. A hole transport layer ("HTL") 40 may be provided between the emission layer 50 and the anode electrode layer 30. An electron transport layer ("ETL") 60 may be provided on the emission layer 50. A cathode electrode layer 70 may be provided on the electron transport layer 60. Although it is not illustrated, a hole injection layer may be further provided between the anode electrode layer 30 and the hole transport layer 40, and an electron injection layer may be further provided between the cathode electrode layer 70 and the electron transport layer 60.

An additional material film 80 may be provided on the cathode electrode layer 70. The additional material film 80 may be transparent or may not be transparent. For example, the additional material film 80 may be formed of a transparent material such as glass, or an opaque material. The additional material film 80 may be a kind of a second substrate, or may be flexible as necessary.

Although in the present embodiment the anode electrode layer 30 is illustrated to be patterned and the cathode electrode layer 70 is illustrated not to be patterned (e.g., as a solid layer), in some cases, the cathode electrode layer 70 may be patterned to be a plurality of electrode elements. Without patterning the anode electrode layer 30, the cathode electrode layer 70 may be patterned, or both of the anode electrode layer 30 and the cathode electrode layer 70 are patterned. Furthermore, the emission layer 50 located between the anode electrode layer 30 and the cathode electrode layer 70 may have a structure patterned in units of sub-pixels corresponding to the patterned anode electrode layer 30 and/or the cathode electrode layer 70. In this case, the hole transport layer 40, the emission layer 50 and the electron transport layer 60 may be all patterned.

The OLED device of FIG. 8 may be a bottom-surface (or rear-surface) emission type device (or bottom-emission device). In other words, light may be emitted from the emission layer 50 toward the transparent substrate 10 as represented by the downward arrows in FIG. 8. A bottom-emission OLED device may not include a micro-cavity structure. In terms of manufacturing process, a bottom-emission device may be more advantageous than a top-emission device. In the present embodiment, the bottom-emission device may be used as an OLED element portion of a display. An example thereof is illustrated in FIG. 9.

Figure 9:
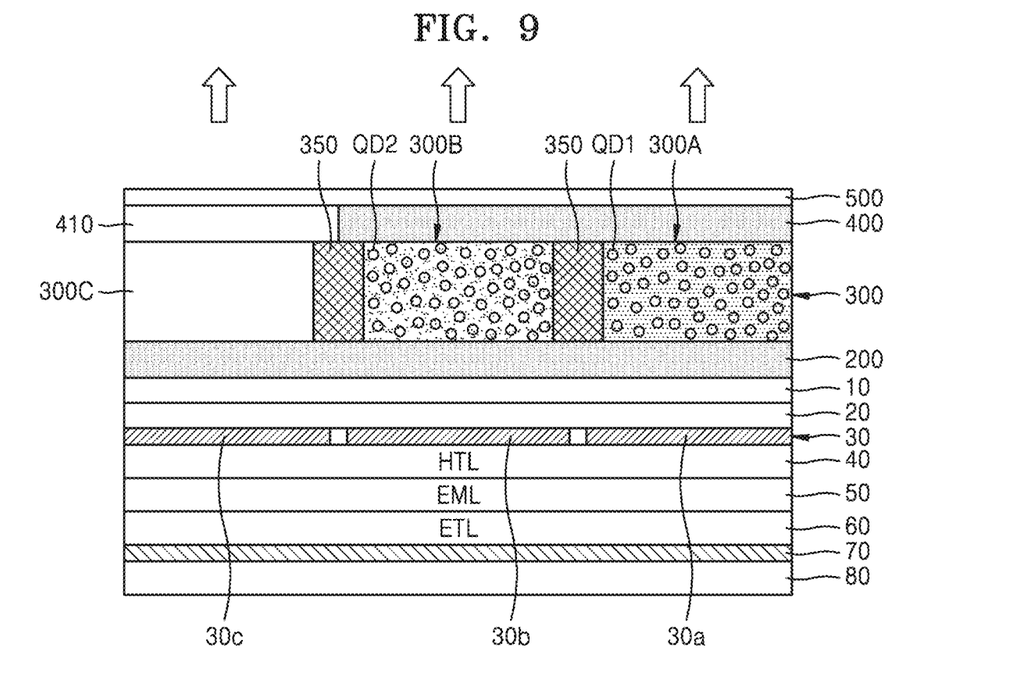
FIG. 9 is a cross-sectional view showing an example of a display apparatus adopting the OLED element portion of FIG. 8 according to an embodiment.

FIG. 9 is a cross-sectional view showing an example of a display apparatus adopting the OLED element portion of FIG. 8 according to an embodiment. The configuration of the first optical film 200, the color control layer 300, the second optical layer 400 and the transparent cover layer 500 of FIG. 9 may be the same or similar to the configurations of those element described in FIG. 1, FIGS. 6 and 7.

Referring to FIG. 9, while the OLED element portion of FIG. 8 is turned upside down, the first optical layer 200, the color control layer 300, and the second optical layer 400 may be formed on the transparent substrate 10. Accordingly, the light generated from the emission layer 50 may be emitted upward on the drawing through the color control layer 300. In this state, the cathode electrode layer 70 and the first optical layer 200 may form a resonance cavity structure. The TFT array layer 20 may be arranged between the emission layer 50 of the OLED substrate 100 and the color control layer 300.

Figure 10:
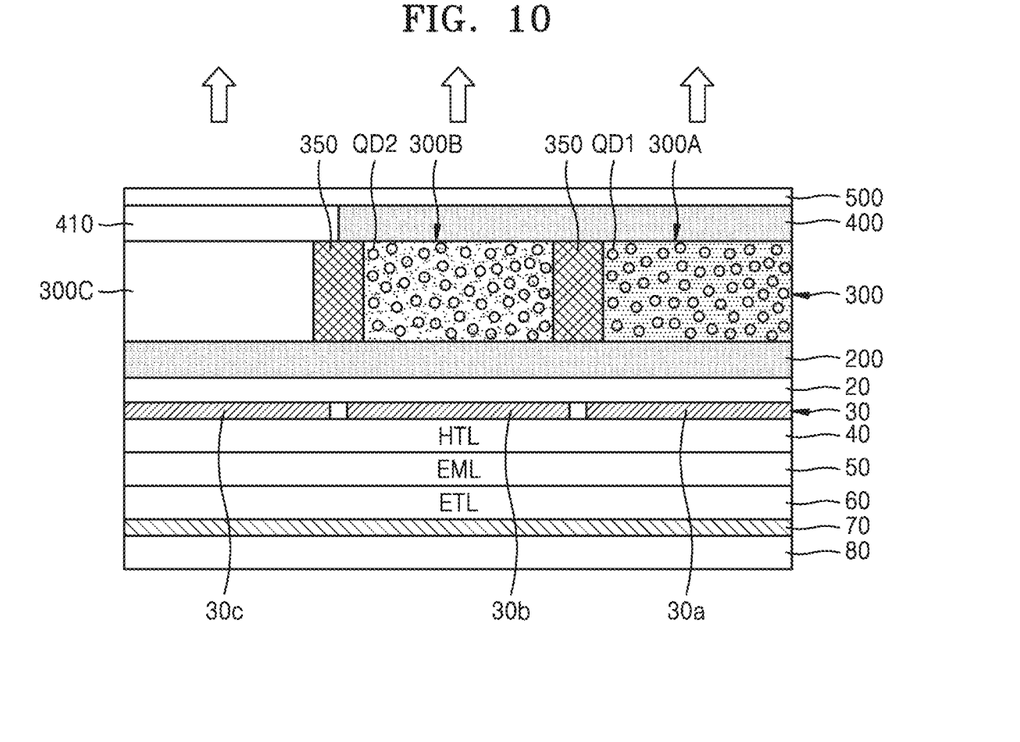
FIG. 10 is a cross-sectional view of an example of a display apparatus adopting the OLED element portion of FIG. 8 according to another embodiment.

According to another embodiment, the transparent substrate 10 may be excluded from FIG. 9, and an example thereof is illustrated in FIG. 10. Referring to FIG. 10, the transparent substrate 10 of FIG. 9, the TFT array layer 20 may be in a contact with the first optical layer 200. After the first optical layer 200 is first provided, by using the first optical layer 200 as a substrate, the TFT array layer 20 to the additional material film 80 may be sequentially formed thereon. In this case, the TFT array layer 20 may be in a direct contact with the first optical layer 200.

FIG. 10 is a cross-sectional view showing an example of a display apparatus adopting the OLED element portion of FIG. 8 according to another embodiment. The configuration of the first optical film 200, the color control layer 300, the second optical layer 400 and the transparent cover layer 500 of FIG. 9 may be the same or similar to the configurations of those element described in FIG. 1, FIGS. 6 and 7.

Alternatively to FIG. 9, after the transparent substrate 10 is removed from the configuration of the OLED element portion of FIG. 8 to expose the TFT array layer 20, the first optical layer 200, the color control layer 300 and the second optical layer 400 of the display apparatus in FIG. 10 may be formed on the TFT array layer 20.

Although FIGS. 8 to 10 illustrate a case of using one emission unit formed of the hole transport layer 40, the emission layer 50 and the electron transport layer 60, a plurality of emission units including the above-described three layers may be used within the OLED substrate (100 in FIGS. 1, 6 and 7) of a display apparatus. In such a display apparatus including the plurality of emission unites, a charge generation layer may be provided respectively between the emission units. In other words, an OLED device having a tandem structure may be used.

According to one or more embodiment, a display apparatus having relatively high light efficiency and excellent color characteristics may be manufactured by respectively applying the two optical layers 200 and 400 having different transmission characteristics and reflection characteristics from each other to upper and lower portions of the color control layer 300 having quantum dots. Furthermore, compared with a conventional LCD, a display apparatus having an improved form factor (e.g., deformable, flexible, etc.) and usefully applicable to various application fields may be manufactured.

Display apparatuses according to one or more embodiment may be applied to a variety of electronic apparatuses in which a visual display is employed. In exemplary embodiment, for example, display apparatuses may be usefully applied to compact electronic apparatuses such as portable devices or wearable devices, and to relatively medium or large-sized electronic apparatuses.

Although there are many detailed descriptions above, they should be interpreted to be examples of detailed embodiments, rather than to be limitations of the scope of right. In exemplary embodiments, for example, one having ordinary skill in the art would understand that the structures and connection relations of the OLED substrate, the color control layer, the first optical layer the second optical layer, and the display apparatus including the same, which are described with reference to FIGS. 1 to 10, may be modified in various ways. In a detailed example, one having ordinary skill in the art would understand that the wavelength range of the light generated from the OLED substrate is not limited to a blue color and may be variously changed, and that the structure and characteristics of the first optical layer, the second optical layer and the color control layer may be variously changed according to the wavelength range of the light generated from the OLED substrate. Furthermore, one having ordinary skill in the art would understand that a separate color filter layer may be further provided on the second optical layer. Furthermore, one having ordinary skill in the art would understand that not only a bottom emission OLED device, but also a front emission OLED device may be used in some cases.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first pixel area and a second pixel area;
   an organic light-emitting device substrate which generates light of a first wavelength range, at each of the first and second pixel areas, the organic light-emitting device substrate comprising a first electrode, a second electrode, and an organic emission layer which is between the first and second electrodes;
   a lower light-recycling structure at each of the first and second pixel areas, the lower-light-recycling structure providing recycled first wavelength light at both of the first and second pixel areas;
   a color control layer which faces the lower light-recycling structure, the color control layer including:
      a color converting material which wavelength-converts the recycled first wavelength light into light of a second wavelength range different from the first wavelength range,
      a transmitting material which maintains the recycled first wavelength light, and
      a single layer structure including the color-converting material and the transmitting material in a same layer as each other;
   an upper light-recycling structure overlapping the lower light-recycling structure, the upper light-recycling structure recycling the recycled first wavelength light from the lower light-recycling structure, to the color control layer;
   a first optical layer which is common to each of the first pixel area, the second pixel area, the lower light-recycling structure and the upper light-recycling structure; and
   a layer which has a thickness common to each of the first pixel area and the second pixel area, the layer comprising:
      a second optical layer which faces the second pixel area, reflects the light of the first wavelength range and transmits the light of the second wavelength range, and forms the upper light-recycling structure together with the first optical layer, and
      a transparent layer which faces the first pixel area.

2. The display apparatus of claim 1, wherein
   the organic light-emitting device substrate generates blue light as the light of the first wavelength,
   the first pixel area is a blue pixel area,
   the second pixel area is provided in plural including a red pixel area and a green pixel area,
   the color control layer comprises:
      the red pixel area comprising the color converting material as a first quantum dot which converts the blue light incident thereto to red color light,
      the green pixel area comprising the color converting material as a second quantum dot which converts the blue light incident thereto to green color light, and
      the blue pixel area comprising the transmitting material which transmits the blue light incident thereto, and
   at each of the red pixel area, the green pixel area and the blue pixel area, the first optical layer reflects the light of the first wavelength range back to the organic light-emitting device substrate.

3. The display apparatus of claim 1, wherein
   the light of the first wavelength range has a central wavelength of about 420 nanometers to about 480 nanometers, and
   the light of the second wavelength range has:
      a central wavelength of about 500 nanometers to about 550 nanometers, or
      a central wavelength of about 600 nanometers to about 650 nanometers.

4. The display apparatus of claim 1, wherein the first optical layer has a reflectance of about 30% to about 70% with respect to the light of the first wavelength range.

5. The display apparatus of claim 1, wherein the first optical layer has a transmittance of about 30% to about 70% with respect to the light of the first wavelength range.

6. The display apparatus of claim 1, wherein
   at least one of the first optical layer and the second optical layer includes a first material layer having a first refractive index and a second material layer having a second refractive index which is alternately and repeatedly stacked with the first material layer,
   the first material layer comprises any one of magnesium fluoride, thorium fluoride, silicon dioxide, aluminum oxide, sodium aluminum fluoride, cryolite and epoxy, and
   the second material layer comprises any one of tantalum pentoxide, niobium pentoxide, zinc sulfide, zinc selenide, hafnium dioxide, zirconium dioxide and titanium dioxide.

7. The display apparatus of claim 1, wherein
   the first optical layer together with the first electrode of the organic light-emitting device substrate provides the lower light-recycling structure as a resonance cavity structure, and
   the recycled first wavelength light defines reinforced light of the first wavelength range which is perpendicularly provided toward the color control layer.

8. The display apparatus of claim 1, wherein the second optical layer comprises an anti-glare processed emitting surface through which display light is provided from the second optical layer for displaying an image.

9. The display apparatus of claim 1, further comprising a thin film transistor layer with which the first and second pixel areas of the organic light-emitting device substrate are controlled to generate the light of the first wavelength range, the thin film transistor layer disposed between the organic light-emitting device substrate and the color control layer.

10. The display apparatus of claim 1, wherein the first optical layer reflects the light of the second wavelength range which is incident thereto from the color control layer.

11. The display apparatus of claim 1, wherein
the first optical layer partially transmits light of the first wavelength range and partially reflects the light of the first wavelength range, and
the light of the first wavelength range which is partially reflected by the first optical layer is recycled by the lower light-recycling structure and defines the recycled first wavelength light, and
the recycled first wavelength light defines reinforced light of the first wavelength range which is perpendicularly provided toward the color control layer.

12. The display apparatus of claim 1, wherein
the first optical layer comprises a first dichroic filter which partially transmits light of the first wavelength range and partially reflects the light of the first wavelength range; and
the second optical layer comprises a second dichroic filter which reflects the light of the first wavelength range, and transmits the light of the second wavelength range.

13. The display apparatus of claim 12, wherein
the first dichroic filter partially transmits and partially reflects a blue light, and reflects a green light and a red light, and
the second dichroic filter reflects the blue light, and transmits the green light and the red light to recycle the blue light between the first optical layer and the second optical layer.

14. The display apparatus of claim 1, wherein
the first pixel area is a blue pixel area,
the second pixel area is a red pixel area or a green pixel area, and
the second optical layer faces the second pixel area and is excluded at the blue pixel area.

15. The display apparatus of claim 14, wherein the transparent layer of the second optical layer extends from the blue pixel area to face the second pixel area.

16. The display apparatus of claim 1, wherein
within the organic light-emitting device substrate, the first electrode, the organic emission layer and the second electrode are in order in a direction towards the first and second optical layers, and
the first optical layer and the first electrode form a resonance cavity structure for the light of the first wavelength.

17. The display apparatus of claim 1, wherein
the first electrode, the organic emission layer, the second electrode and the first optical layer are in order in one direction, and
in the one direction from the organic light-emitting device substrate, the first optical layer, the color control layer and the second optical layer are in order.

* * * * *